United States Patent [19]
Notoya

[11] Patent Number: 6,118,123
[45] Date of Patent: Sep. 12, 2000

[54] ELECTRON PROBE MICROANALYZER

[75] Inventor: Satoshi Notoya, Tokyo, Japan

[73] Assignee: JEOL Ltd., Tokyo, Japan

[21] Appl. No.: 09/012,022

[22] Filed: Jan. 22, 1998

[30] Foreign Application Priority Data

Feb. 5, 1997 [JP] Japan .................................. 9-022875

[51] Int. Cl.[7] .................................................. H01J 37/21
[52] U.S. Cl. ........................... 250/310; 250/307; 250/397
[58] Field of Search ..................................... 250/307, 310, 250/397; 378/43

[56] References Cited

U.S. PATENT DOCUMENTS

| 3,629,579 | 12/1971 | Naltou ..................... 250/310 |
| 4,440,475 | 4/1984 | Colliaux .................. 250/310 |
| 5,128,545 | 7/1992 | Komi ...................... 250/310 |
| 5,192,866 | 3/1993 | Komi ...................... 250/310 |
| 5,199,057 | 3/1993 | Tamura et al. ............ 378/43 |
| 5,656,812 | 8/1997 | Takashi .................... 250/310 |

OTHER PUBLICATIONS

"Development of a High–Speed Optical Microscope Auto–Focus Control System for EPMA", S. Notoya et al., *Proceedings Microscopy and Microanalysis* 1996, Aug. 11–15, 1996 (pp. 442–443).

Primary Examiner—Bruce C. Anderson
Attorney, Agent, or Firm—Webb Ziesenheim Logsdon Orkin & Hanson, P.C.

[57] ABSTRACT

There is disclosed an electron probe microanalyzer capable of achieving focusing after movement of a specimen in a shorter time than conventional, thus improving the total measuring efficiency. When movement into a specified analysis point on the specimen is completed, an automatic focusing device automatically performs a focusing operation consisting of scanning a relatively narrow range. If this operation is performed unsuccessfully, the automatic focusing device automatically performs a second focusing operation consisting of scanning a wider range. Thus, the instrument searches for a focal point.

13 Claims, 3 Drawing Sheets

ELECTRON PROBE MICROANALYZER

FIELD OF THE INVENTION

The present invention relates to an electron probe microanalyzer equipped with a wavelength-dispersive x-ray spectrometer (WDS) and with a light microscope and, more particularly, to focusing the light microscope at an analysis point on a specimen.

DESCRIPTION OF THE PRIOR ART

In an electron probe microanalyzer (EPMA) equipped with a wavelength-dispersive spectrometer (WDS), the analysis point on a specimen, the analyzer crystal and the slit of an x-ray detector must be placed in positions on a Rowland circle. As shown in FIG. 4, x-rays generated at a point on a specimen diverge and reach a curved analyzer crystal, which in turn diffracts the x-rays. The x-rays are again focused and pass through a slit of the x-ray detector. Thus, the x-rays are detected by the detector. The point from which the x-rays are generated, the analyzer crystal and the slit of the x-ray detector lie on a Rowland circle.

Therefore, the operator must place the specimen analysis point in position on the Rowland circle of the wavelength-dispersive spectrometer whenever a measurement is made. In principle, this positioning operation needs to be performed for each of three dimensions, x, y and z, but for the two dimensions x and y, no such positioning operation is necessitated because the position hit by the electron beam in the spectrometer has been previously adjusted so as to be placed in position on the Rowland circle. Consequently, it is only necessary for the operator to adjust the height or the dimension z in the vertical direction. The focusing referred to herein is the positioning along the axis z.

Various known methods are available to achieve the focusing. A method that has enjoyed wide acceptance is to incorporate a light microscope having a small depth of focus into the microanalyzer and to use it. The microscope is previously set up as follows. Two crossing lines are placed in a given position within the field of view of the optical microscope, e.g., the intersection, x and y, of the crossing lines. This given position (indicated by x and y) and the position z of the focus of the optical microscope are aligned with a certain position on the Rowland circle and made stationary. Also, an adjustment is made so that the electron beam hits the intersection of the two crossing lines.

If the instrument is set up in this way, what the operator must perform for each measurement is only to search the field of view of the incorporated optical microscope for a portion of the specimen to be analyzed and to align the specimen stage along the x, y and z axes so that the observed portion is seen most clearly at the intersection of the crossing lines.

This method assures high accuracy in alignment along the axes x and y by increasing the magnification of the incorporated optical microscope. Also, the method offers high accuracy in alignment along the axis z by making use of the fact that the depth of focus is very small.

In recent years, an instrument combining the above-described optical microscope and an automatic focusing mechanism for achieving automated focusing has been developed. For example, in a known method, an image signal obtained by an optical microscope is accepted into a computer or the like and processed while automatically scanning the specimen along the height z at given positions x and y. The height z giving the greatest contrast is regarded as the focal point. This is known as the search method or the scan method.

Where automated focusing is attempted by the prior art search method, it takes a long time to achieve the focusing because the range in which the stage carrying a specimen can move is always fully scanned. For example, where the range is about 2 mm, the time is approximately 20 seconds. If the range is limited to about 0.4 mm, the time is about 5 seconds. As a result, the total operability and measuring efficiency are deteriorated.

SUMMARY OF THE INVENTION

The present invention is intended to solve the foregoing problems. It is an object of the present invention to provide an electron probe microanalyzer that can realize a focused condition in a shorter time than heretofore, thus providing improved total operability and measuring accuracy.

When a specimen is initially set in an electron probe microanalyzer, the surface of the specimen that will be partially analyzed is usually not placed in position on the Rowland circle. Obviously, therefore, it is desired to scan a wide range close to the whole movable range of the height of the specimen stage by the search method for accomplishing a focused condition.

It is now assumed that an operator brings some analysis point on a specimen to a focus, then observes the surface or performs an x-ray analysis, and moves the field of view of the optical microscope by shifting the specimen stage in order that the electron beam hits the next observed point or analysis point. It can be considered that if both analysis points are somewhat spaced from each other or if the specimen surface is slightly uneven, the sample surface height rarely varies greatly. In this case, the range of the specimen scanned vertically can be narrowed in achieving automated focusing by the search method. This can shorten the time required to bring the optical microscope image to a focus by the search method.

An electron probe microanalyzer according to a preferred embodiment of the invention comprises a wavelength-dispersive x-ray spectrometer, a specimen stage for placing a specimen thereon, a stage-driving means for driving the specimen stage, an optical microscope permitting one to observe a surface of the specimen to be analyzed, a sensor (or a set of sensors) for accepting an image of the specimen from the microscope, and an automatic focusing means. The automatic focusing means drives the specimen stage via the stage-driving means according to the output signal from the sensor, thus automatically focusing the optical microscope image. This microanalyzer is characterized in that the specimen stage is scanned in the z-direction over a range narrower than the movable range of the specimen stage in the z-direction during the automatic focusing operation.

Other objects and features of the invention will appear in the course of the description thereof, which follows.

DESCRIPTION OF THE PREFERRED EMBODIMENTS

Figure 1:
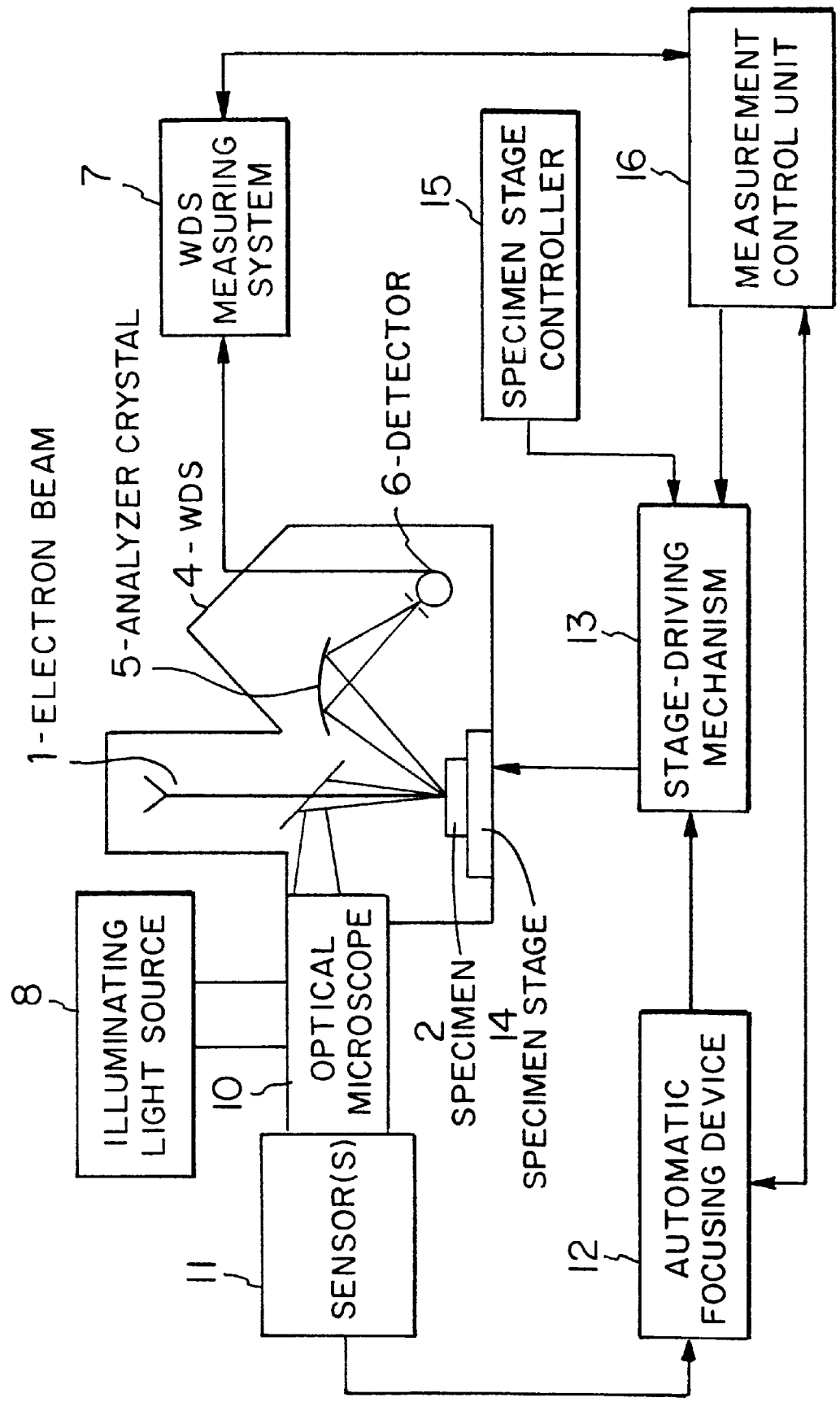
FIG. 1 is a block diagram of an electron probe microanalyzer according to a preferred embodiment of the invention.

Referring to FIG. 1, there is shown an electron probe microanalyzer embodying the concept of the present invention. This instrument directs an electron beam 1 at a specimen 2, producing characteristic x-rays from the specimen 2. The emitted characteristic x-rays are spectrally dispersed by an analyzer crystal 5 in a wavelength-dispersive x-ray spectrometer 4 and detected by a detector 6. The output signal from the detector 6 is supplied to a wavelength-dispersive x-ray measuring system 7, where a counting operation or other given processing is performed. The wavelength-dispersive x-ray measuring system 7 is made up of an amplifier, a timer, a counter, and other components and is of well-known construction. Furthermore, this is not essential for the present invention. Therefore, the wavelength-dispersive x-ray measuring system 7 is not described herein.

Light from an illuminating light source 8 for an optical microscope 10 is projected onto a specimen 2. Light reflected from the specimen 2 is guided to a sensor 11 via the optical microscope 10. That is, the sensor 11 detects the image obtained by the optical microscope 10.

An automatic focusing device 12 performs automated focusing and causes a stage-driving mechanism 13 to drive a specimen stage 14. The automatic focusing device 12 detects a focal point from the image signal from the sensor 11. On detecting the focal point, the automatic focusing device 12 sends a control signal to the stage-driving mechanism 13 to bring the scanned specimen stage 14 to a stop in the focal point. At the same time, the focusing device 12 signals a measurement control unit 16 that the focusing operation is complete.

The stage-driving mechanism 13 can be manually driven through a specimen stage controller 15. If it is necessary to manually move the specimen 2, the operator can operate the specimen stage controller 15 so that movement of the stage 14 is manually controlled.

The optical microscope 10 has been previously set up so that the optical axis of this optical microscope 10 corresponding to the aforementioned intersection of the crossing lines agrees with the optical axis of the electron beam 1 corresponding to the position hit by the electron beam. Furthermore, the focal point on the optical axis of the optical microscope 10 is coincident with the focus of the wavelength-dispersive x-ray spectrometer 4 corresponding to the above-described given position on the Rowland circle. The automatic focusing device 12 performs the automated focusing by image processing techniques to search for the focal point. Since these techniques are well known in the art, they are not described in detail herein.

The measuring control unit 16 has a function of managing the operation of the whole electron probe microanalyzer and consists of a CPU and peripheral circuits. The measuring control unit 16 is also fitted with a keyboard or other entry device. Thus, the operator can move the specimen stage 14 into an arbitrary position through the measuring control unit 16.

Figure 2:
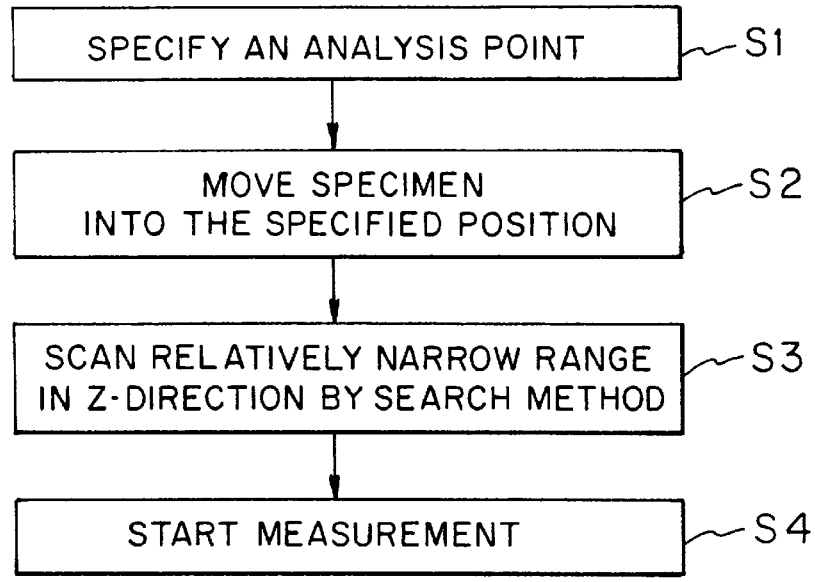
FIG. 2 is a flowchart illustrating the operations of the microanalyzer shown in FIG. 1.

The operations of the electron probe microanalyzer shown in FIG. 1 are next described by referring to the flowchart of FIG. 2. First, the operator specifies a position, i.e., an analysis point on the surface of the specimen 2 (step 1). For example, the operator specifies an absolute position via the entry device ancillary to the measuring control unit 16. Alternatively, positions may be previously stored in a storage medium by an appropriate method such that the measuring control unit 16 may read data about the stored positions. In a still other example, the operator specifies a line or rectangular region and the measuring control unit 16 specifies regular or lattice points in a given interval within the specified line or region.

When a position is specified, the measuring control unit 16 drives the specimen stage 14 via the stage-driving mechanism 13 to bring the specimen 2 into the position specified in step 1 (step 2).

When the movement of the specimen 2 is complete, the measuring control unit 16 instructs the automatic focusing device 12 to perform an automatic focusing operation. The automatic focusing device 12 drives the z-drive mechanism of the stage-driving mechanism 13, receives the image signal from the sensor 11 and performs an automatic focusing operation by the search method. At this time, the stage-driving mechanism 13 is driven to scan a relatively narrow range in the z-direction (step 3).

This scanned region is narrower than the whole range in which the stage 14 is driven in the z-direction by the stage-driving mechanism 13. That is, the scanned range is a practical range permitting the focal point to be found in a short time. In particular, where the total range in which the stage 14 is driven in the z-direction is several millimeters, the scanned range is set to the present height (i.e., obtained immediately after the movement)±approximately 100 to 300 $\mu$m. Such height may be replaced with the z-coordinate before the movement.

If step 3 for scanning the relatively narrow range in the z-direction is carried out and if a focused condition is obtained by the search method, the automatic focusing device 12 causes the stage-driving mechanism 13 to move the stage 14 into the found focal point and the stage is stopped there. The focusing device 12 informs the measurement control unit 16 of the completion of the focusing operation. This enables measurement. That is, the operator can observe the image, can operate the measurement control unit 16 to perform an analysis, or the measurement control unit 16 automatically starts a measurement (step 4).

As described thus far in this electron probe microanalyzer, a focusing operation is automatically performed by the search method for scanning the relatively narrow range in the z-direction after the specimen 2 has been moved. Therefore, the focal point can be quickly found even by the search method. This improves the operability. Hence, the total measuring efficiency can be enhanced.

We have confirmed that if the specimen 2 has been moved, the focal point can be found normally by the search method for scanning the relatively narrow range in the z-direction as illustrated in step 3 of FIG. 2. However, if the surface of the specimen 2 is greatly uneven, this search method may not find the focal point. In this case, the processing may be modified as illustrated in the flowchart of FIG. 3.

Figure 3:
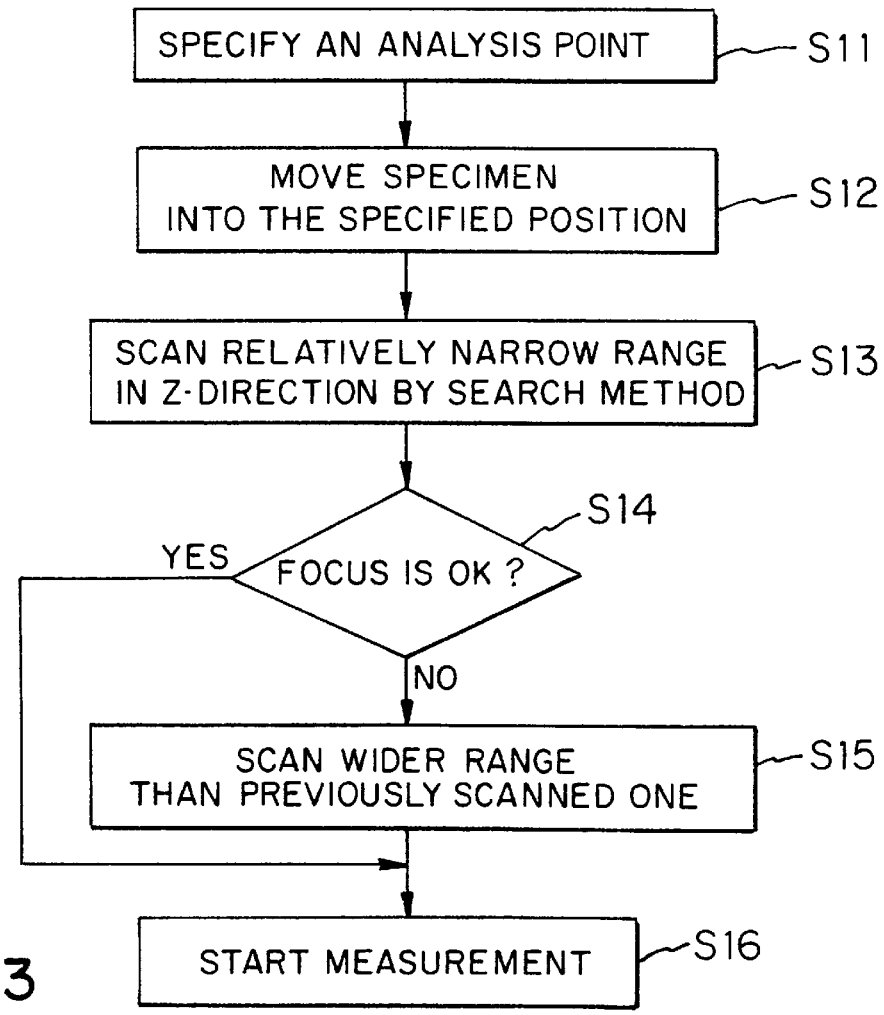
FIG. 3 is a flowchart illustrating alternate operations of the microanalyzer shown in FIG. 1.
Figure 4:
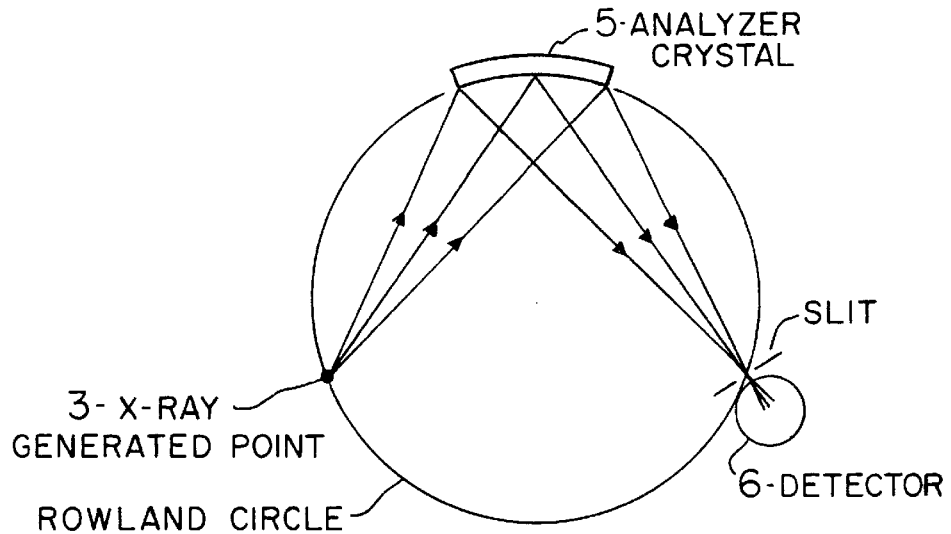
FIG. 4 is a diagram illustrating the geometrical relations among a Rowland circle, a point at which x-rays are generated, an analyzer crystal, and the slit of an x-ray detector.

In FIG. 3, steps 11–13 are the same as steps 1–3 of FIG. 2. A relatively narrow range is scanned and searched in the z-direction by the search method (step 13). A decision is made as to whether a focal point has been found (step 14). If the result of this decision is NO, control goes to step 15 in which a wider range is scanned and searched in the z-direction. This wider range is about twice or more wider than the previously scanned range. This wider range can be increased almost up to the whole range in which the stage-driving mechanism 13 can drive the stage 14 in the z-direction.

The measurement control unit 16 makes the decision of step 14 according to the result of the focusing operation performed by the automatic focusing device 12. If the result of the decision is that focused condition is not accomplished, the control unit 16 orders the automatic focusing device 12 to scan and search in the z-direction a range wider than the range previously scanned in step 15. Then control returns to step 14 where the measurement control unit 16 makes a decision as to whether a focused condition is accomplished. If no focal point is found again, the measurement control unit 16 instructs the automatic focusing device 12 to scan and search a range in the z-direction, it being noted that this range is automatically made wider than the range scanned previously in step 15. Of course, if the result of the decision of step 14 is that a focal point has been found, a measurement is performed (step 16).

In the above-described search method, successively wider ranges are scanned in the z-direction. More specifically, a range (e.g., ±50 $\mu$m) narrower than the aforementioned ±100 to 300 $\mu$m is initially scanned and searched. If no focused condition is obtained, the scanned range is doubled to ±100 $\mu$m. If this does not result in a focused condition, the range is again doubled to ±200 $\mu$m, and so forth. In this way, the scanned range is automatically extended successively. It is also possible to previously set plural ranges to be scanned in the z-direction; these ranges may be searched from narrower to broader ranges. Note that it is not always required that these ranges form geometric series. Moreover, all of these functions may be incorporated and the operator may select a desired one out of them according to the need.

The above-described automatic focusing mechanism effects the trace method, as well as the search method. For example, two sets of sensors are used to obtain two image signals of different foci at the same time. Their contrasts are compared. A focal point is calculated from the result of the comparison. The height z of the specimen is controlled and the specimen is brought to the focal point. This trace method needs only two signals. In addition, they can be obtained at the same time. Consequently, the time it takes for the trace method to reach a focused state is much shorter (on the order of 1 second or less) than in the search method. We tried to apply this method to electron probe microanalysis and have found that the following problems take place. An electron probe microanalyzer using an optical microscope of quite short depth of focus often calculates the focal point erroneously unless the defocus is quite small (on the order of several micrometers or less). This disturbs the operation of the instrument, thus greatly impairing the practicability. This is explained as follows. Where the defocus in greater than the depth of focus, the signal-to-noise ratio of the two image signals deteriorates. This makes the calculation of the focal point inaccurate.

A conceivable method for correcting the drawback with the trace method starts with attempting to perform a focusing operation by the trace method. If an unsatisfactory result arises, the method is automatically switched to the search method described above. A method combining the trace method and the search method is next described by referring to the flowchart of FIG. 5.

Figure 5:
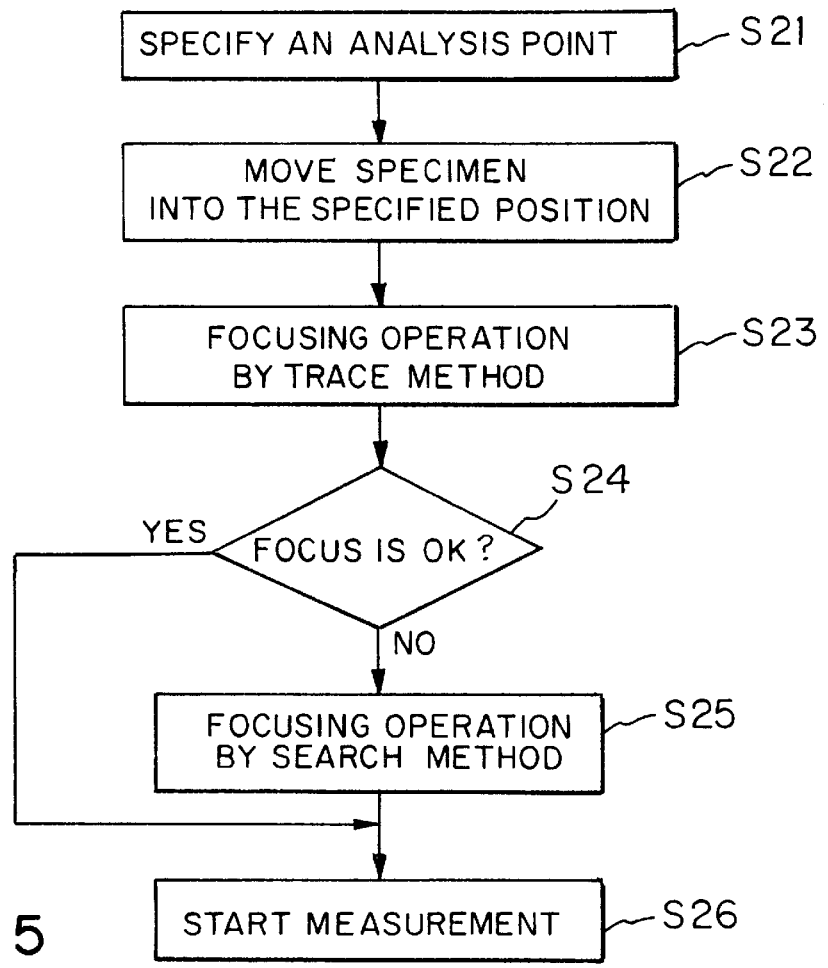
FIG. 5 is a flowchart illustrating further operations of the microanalyzer shown in FIG. 1.

Steps 21 and 22 of FIG. 5 are the same as steps 1 and 2 of FIG. 2. In the next step 23, the measurement control unit 16 causes the automatic focusing device 12 to perform an automatic focusing operation by the trace method.

Then, the automatic focusing device 12 accepts image signals from the sensors 11 and carries out an automatic focusing operation by the trace method. In the next step 24, the measurement control unit 16 makes a decision as follows. If the range reliably focused by the trace method by means of the automatic focusing device 12 is ±3 $\mu$m, for example, and if the focal point calculated by the automatic focusing device 12 lies ±3 $\mu$m of the present height z, then the control unit 16 judges that a focused condition is achieved. If the calculated focal point is outside this range, or ±3 $\mu$m of the present height z, then the control unit judges that the result of the calculation is unreliable. If the result of the decision made in this step 24 is that a focused condition is not achieved, control goes to step 25 where an automatic focusing operation (step 3 of FIG. 2 or steps 13–15 of FIG. 3) is performed by the search method including the improvement described previously. The operation for this search method has been already described in detail. A measurement in step 26 is the same as step 4 of FIG. 2.

While the preferred embodiment of the present invention has been described thus far, it is to be understood that the invention is not limited thereto but rather various changes and modifications are possible. In the above embodiment, the decision as to whether a focused state is reached or not by the trace method is made according to the deviation of the focal point from the present position. If the automatic focusing device 12 has a reliable function of making a decision as to whether a focused state is accomplished, then this function may be utilized. Furthermore, in the above embodiment, the specimen is translated along the three orthogonal axes x, y and z. Of course, the specimen may be rotated or tilted.

As described in detail thus far in the present invention, a range in which the specimen stage is scanned in the z-direction for automated focusing is made narrower than the movable range of the specimen stage in the z-direction. In consequence, the automated focusing is accomplished in a short time even by the search method. If the first focusing operation is unsuccessfully performed, the scanned range is extended automatically. Thus, the focusing operation is carried out automatically under every circumstance.

Also, in the present invention, a focusing operation is first tried by the trace method. If it fails, the method is automatically switched to the search method.

Consequently, automated focusing is accomplished in a still shorter time. Where the specimen is frequently moved during measurements with an electron probe microanalyzer, automated focusing is achieved quickly and reliably. This improves the operability and the measuring efficiency.

Having thus described my invention with the detail and particularity required by the Patent Laws, what is desired protected by Letters Patent is set forth in the following claims.

What is claimed is:

1. An electron probe microanalyzer comprising:
    a wavelength-dispersive x-ray spectrometer;
    a specimen stage for placing a specimen thereon, said specimen stage being capable of moving within a first range in a z-direction;
    a stage-driving means for driving said specimen stage;
    an optical microscope permitting one to observe a surface of the specimen to be analyzed;
    a sensor for accepting an image from said optical microscope;
    an automatic focusing means for causing said stage-driving means to scan said specimen stage in the z-direction within a second range, detecting the focused z-position according to signals from said sensor, and causing said stage-driving means to drive said specimen stage to the detected z-position; and a controller for controlling said automatic focusing means;

wherein said controller sets said second range to be narrower than said first range, and causes said automatic focusing means to perform focusing operation.

2. The electron probe microanalyzer of claim 1, wherein if an initial focusing operation is performed unsuccessfully, said second range scanned is extended automatically and the automatic focusing is again tried.

3. The electron probe microanalyzer of claim 2, wherein a range scanned next is approximately twice or more as wide as a range scanned previously.

4. An electron probe microanalyzer comprising:

a wavelength-dispersive x-ray spectrometer;

a specimen stage for placing a specimen thereon, said specimen stage being capable of moving within a first range in a z-direction;

a stage-driving means for driving said specimen stage;

an optical microscope permitting one to observe a surface of said specimen to be analyzed;

a sensor for accepting an image from said optical microscope;

an automatic focusing means for causing said stage-driving means to scan said specimen stage in the z-direction within a second range, detecting the focused z-position according to signals from said sensor, and causing said stage-driving means to drive said specimen stage to the detected z-position; and a controller for controlling said automatic focusing means;

wherein said controller sets said second range to be narrower than said first range and including the z-coordinate before or after an analysis point on said specimen is moved into another analysis point, and causes said automatic focusing means to perform focusing operation.

5. The electron probe microanalyzer of claim 4, wherein if an initial focusing operation is performed unsuccessfully, said second range scanned is extended automatically and the automatic focusing is again tried.

6. The electron probe microanalyzer of claim 5, wherein a range scanned next is approximately twice or more as wide as a range scanned previously.

7. An electron probe microanalyzer comprising:

a wavelength-dispersive x-ray spectrometer;

a specimen stage for placing a specimen thereon;

a stage-driving means for driving said specimen stage;

an optical microscope permitting one to observe a surface of said specimen to be analyzed;

sensors for accepting two images of different focus for a trace method and a sensor for accepting an image for a search method from said optical microscope;

an automatic focusing means for performing a first focusing operation by the trace method in which a focal point is calculated from results of a comparison of contrasts of said two image signals, and for performing a second focusing operation by the search method in which said automatic focusing means causes said stage-driving means to scan said specimen stage in the z-direction, detecting the focused z-position according to signals from said sensor, and causing said stage-driving means to drive said specimen stage to the detected z-position; and a controller for controlling said automatic focusing means;

wherein said controller causes said automatic focusing means to perform said first focusing operation, and judges whether said first focusing operation is performed successfully or not, if not, causes said automatic focusing means to perform said second focusing operation.

8. An electron probe microanalyzer comprising:

a wavelength-dispersive x-ray spectrometer;

a specimen stage for placing a specimen thereon, said specimen stage being capable of moving within a first range in a z-direction;

a stage-driving means for driving said specimen stage;

an optical microscope permitting one to observe a surface of said specimen to be analyzed;

sensors for accepting two images of different focus for a trace method and a sensor for accepting an image for a search method from said optical microscope;

an automatic focusing means for performing a first focusing operation by the trace method in which a focal point is calculated from results of a comparison of contrasts of said two image signals, and for performing a second focusing operation by the search method in which said automatic focusing means causes said stage-driving means to scan said specimen stage in the z-direction within a second range detecting the focused z-position according to signals from said sensor, and causing said stage-driving means to drive said specimen stage to the detected z-position; and a controller for controlling said automatic focusing means;

wherein said controller causes said automatic focusing means to perform said first focusing operation, and judges whether said first focusing operation is performed successfully or not, if not, sets said second range to be narrower than said first range, and causes said automatic focusing means to perform said second focusing operation.

9. The electron probe microanalyzer of claim 8, wherein if said second focusing operation by said search method is performed unsuccessfully, a third focusing operation in which a still wider range is scanned is automatically performed.

10. The electron probe microanalyzer of claim 9, wherein a range scanned next by the search method is approximately twice or more as wide as a range scanned previously.

11. An electron probe microanalyzer comprising:

a wavelength-dispersive x-ray spectrometer;

a specimen stage for placing a specimen thereon, said specimen stage being capable of moving within a first range in a z-direction;

a stage-driving means for driving said specimen stage;

an optical microscope permitting one to observe a surface of said specimen to be analyzed;

sensors for accepting two images of different focus for a trace method and a sensor for accepting an image for a search method from said optical microscope;

an automatic focusing means for performing a first focusing operation by the trace method in which a focal point is calculated from results of a comparison of contrasts of said two image signals, and for performing a second focusing operation by the search method in which said automatic focusing means causes said stage-driving means to scan said specimen stage in the z-direction within a second range detecting the focused z-position according to signals from said sensor, and causing said stage-driving means to drive said specimen stage to the detected z-position; and a controller for controlling said automatic focusing means;

wherein said controller causes said automatic focusing means to perform said first focusing operation, and judges whether said first focusing operation is performed successfully or not, if not, sets said second range to be narrower than said first range and including the z-coordinate before or after an analysis point on said specimen is moved into another analysis point, and causes said automatic focusing means to perform said second focusing operation.

12. The electron probe microanalyzer of claim 11, wherein if said second focusing operation by said search method is performed unsuccessfully, a further focusing operation in which a still wider range is scanned is automatically performed.

13. The electron probe microanalyzer of claim 12, wherein a range scanned next by the search method is approximately twice or more as wide as a range scanned previously.

* * * * *